(12) United States Patent
Cheng et al.

(10) Patent No.: US 10,861,714 B2
(45) Date of Patent: Dec. 8, 2020

(54) HEATING OF A SUBSTRATE FOR EPOXY DEPOSITION

(71) Applicant: ASM Technology Singapore Pte Ltd, Singapore (SG)

(72) Inventors: Pak Lun Cheng, Hong Kong (HK); Jun Qi, Hong Kong (HK); Yong Wang, Hong Kong (HK); Chao Liu, Chengdu (CN); Pingliang Tu, Hong Kong (HK); Ka Fai Fung, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 16/247,613

(22) Filed: Jan. 15, 2019

(65) Prior Publication Data

US 2020/0227281 A1 Jul. 16, 2020

(51) Int. Cl.
*H01L 21/50* (2006.01)
*H01L 21/02* (2006.01)
*H01L 21/67* (2006.01)
*H01L 23/00* (2006.01)
*H01L 21/60* (2006.01)

(52) U.S. Cl.
CPC ........ *H01L 21/50* (2013.01); *H01L 21/02002* (2013.01); *H01L 21/67126* (2013.01); *H01L 24/95* (2013.01); *H01L 2021/60097* (2013.01); *H01L 2224/8385* (2013.01)

(58) Field of Classification Search
CPC combination set(s) only.
See application file for complete search history.

(56) References Cited

U.S. PATENT DOCUMENTS

| | | | | |
|---|---|---|---|---|
| 2004/0037748 A1* | 2/2004 | Hasan | ................... | B01L 3/0244 506/43 |
| 2004/0041279 A1* | 3/2004 | Fuller | ................... | H01L 21/563 257/782 |
| 2008/0199713 A1* | 8/2008 | James | ................... | C09D 5/033 428/511 |
| 2014/0291834 A1* | 10/2014 | Gandhi | ................... | H01L 24/81 257/737 |
| 2016/0011518 A1* | 1/2016 | Xie | ........................ | G03F 7/38 430/322 |

FOREIGN PATENT DOCUMENTS

JP S58-53443 A 3/1983

* cited by examiner

*Primary Examiner* — Ratisha Mehta
(74) *Attorney, Agent, or Firm* — Ostrolenk Faber LLP

(57) ABSTRACT

A semiconductor die is bonded using epoxy onto a substrate supported on a heating platform. After preheating the substrate with the heating platform to a temperature of between 25° C. and 60° C., an epoxy dispenser deposits an epoxy dot onto the substrate before the semiconductor die is placed onto the epoxy dot with a pick head to thereby bond the semiconductor die onto the substrate.

13 Claims, 2 Drawing Sheets

HEATING OF A SUBSTRATE FOR EPOXY DEPOSITION

FIELD OF THE INVENTION

The invention relates to the deposition of epoxy onto a substrate as a medium for bonding semiconductor devices onto the substrate.

BACKGROUND AND PRIOR ART

Epoxy (especially silver epoxy) is a widely-used die attach adhesive for attaching semiconductor chips (or semiconductor dice) onto a substrate, particularly a lead frame. Silver epoxy is often stamped or dispensed onto the target substrate surface in a material transfer process, which is followed by a die bonding process. A drop of epoxy is transferred onto a bond pad on the substrate. Thereafter, the semiconductor die is placed onto the drop of epoxy for bonding the semiconductor die onto the substrate. As the components are small, they only require very small epoxy dots for successful epoxy die attach. Good epoxy coverage with no voiding and a controlled, thin bondline is critical to maximize thermal transfer, ensure mechanical strength and minimize stresses. Squeeze-out by the semiconductor die during bonding must be controlled to prevent shorting or bridging, and epoxy must be placed in precise locations to maximize yield.

Pin transfer is a common way of selectively depositing a semi-solid or liquid material, such as epoxy. A pin is dipped into a reservoir of epoxy having a grooved well, where the pin is coated with epoxy. Next, the pin is lifted out of the epoxy reservoir and placed down onto a bond pad of the substrate. A portion of epoxy that travelled on the pin sticks to the bond pad as the pin is lifted away. This method is repeatable and is used extensively in semiconductor packaging. It is used because it deposits flux very quickly, and facilitates compensation for changes in substrate height.

Where only one pin is used to transmit epoxy, this process is called stamping. Stamp transfer has the benefit of being simple to set up because there are few parameters that need to be adjusted. Dot size is determined by the epoxy thickness at the epoxy stamping well and the epoxy stamping tool profile.

An example of a transfer pin used in the prior art can be found in Japanese patent publication JPS5853443(A) entitled, "Heat Transfer Stamping Device". A holding block is connected to a support for the block such that it can move along a spherical surface. Using a ball-and-socket joint mechanism, a parallel relationship is consistently achieved between a projected stamping face and a transfer surface. Therefore, the projected stamping face is always brought into close contact with the transfer surface, resulting in clear and uniform stamping.

Shape defects, such as that caused by a low degree of wetting of epoxy dots on the substrate surface may affect the quality and yield of the die bonding process. It is recognized that most of the silver epoxy in the market is in paste form and have a very high viscosity, which often creates epoxy dots with various kinds of shape defects.

When transferring such epoxy in paste form, there is a concern about its high viscosity, which might cause a quantity of epoxy dropped onto the bond pad to be uncertain. Hence, in order to improve the die bonding performance by improving the dispensing process to achieve a high degree of wetting of the epoxy dots, it is beneficial for the applied epoxy to have a sufficiently low viscosity. Heat is typically applied to the transfer pin to heat the epoxy carried by it so as to lower a viscosity of the epoxy when it is being transferred and dropped onto the bond pad. However, to further avoid other problems as tailing or dripping resulting from the lowered viscosity during the transfer process, lifting of the transfer pin away from the bond pad should be conducted at a relatively low speed. Otherwise, if an incorrect quantity of epoxy is left on the bond pad, it may result in a defective bond.

Issues such as epoxy tailing, dripping and so-called volcanoes (where a void is presented in the middle of the epoxy deposited) may lead to die bond failure due to shorting or to voids created in the layer of epoxy. Whilst process optimization may be adopted to ameliorate or control some of the above issues, such by adopting as slower epoxy transfer speed, this often compromises on process speed and leads to significant reduction in production output (in terms of the units produced per hour or UPH).

SUMMARY OF THE INVENTION

It is thus an object of the invention to seek to provide a method and apparatus for transferring epoxy which increases the reliability of the volume of epoxy deposited, while still maintaining relative high deposition speeds.

According to a first aspect of the invention, there is provided a method for bonding a semiconductor die onto a substrate using epoxy, comprising the steps of: supporting the substrate on a heating platform; conducting preheating of the substrate with the heating platform to a temperature of between 25° C. and 60° C., after preheating the substrate to the said temperature, using an epoxy dispenser to deposit an epoxy dot onto the substrate, wherein a viscosity of the epoxy deposited is reduced; and thereafter placing the semiconductor die onto the epoxy dot with a pick head to thereby bond the semiconductor die onto the substrate.

According to a second aspect of the invention, there is provided an apparatus for bonding a semiconductor die onto a substrate using epoxy, the apparatus comprising: a heating platform for supporting the substrate, the heating platform being operative to preheat the substrate to a temperature of between 25° C. and 60° C.; an epoxy dispenser for depositing an epoxy dot onto the substrate which has been preheated to the said temperature, wherein a viscosity of the epoxy deposited is reduced; and a pick head for placing the semiconductor die onto the epoxy dot to thereby bond the semiconductor die onto the substrate.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

An exemplary method and apparatus for inspecting bonded semiconductor dice in accordance with the invention will now be described with reference to the accompanying drawings, in which.

DETAILED DESCRIPTION OF THE PREFERRED EMBODIMENT OF THE INVENTION

Figure 1:
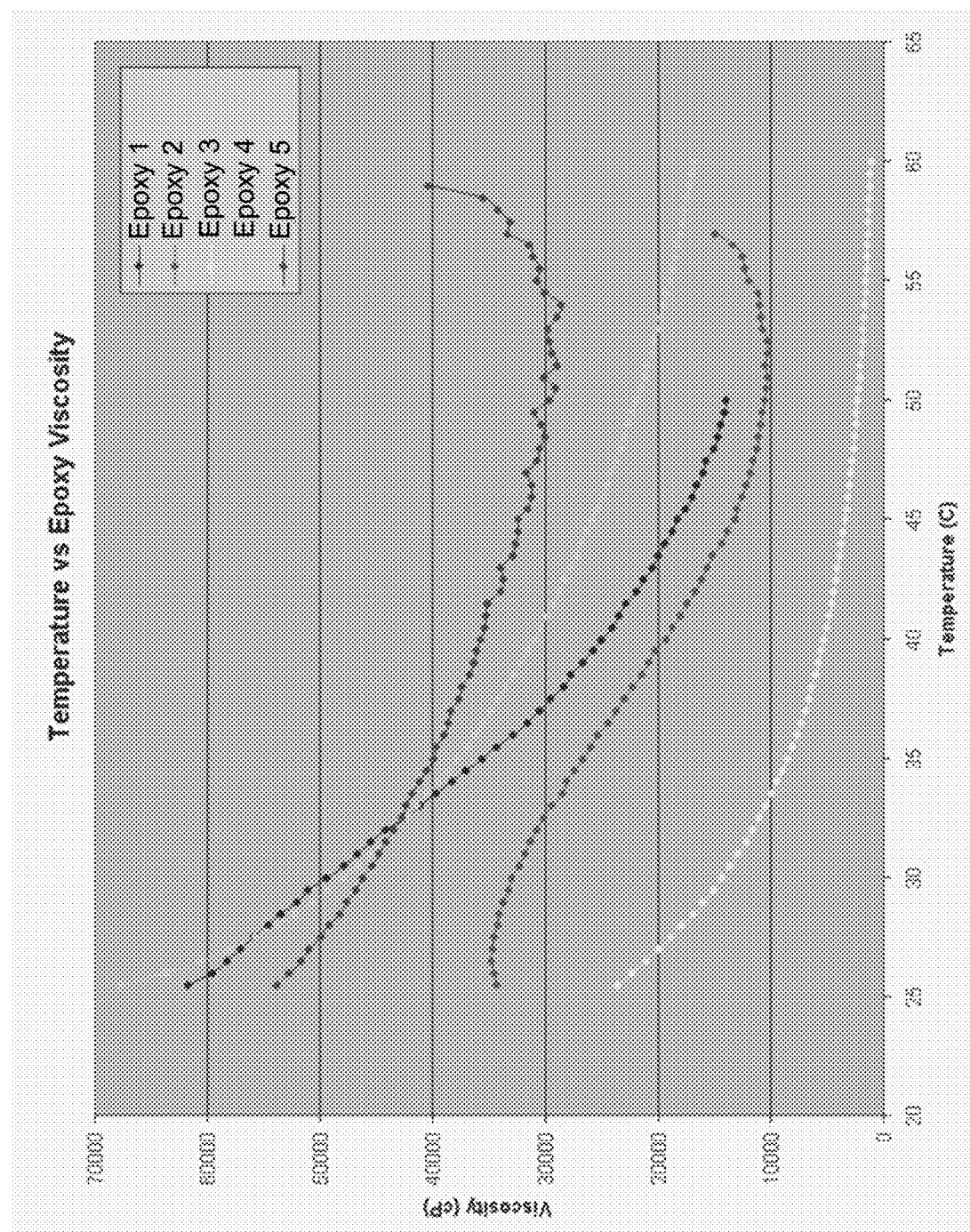
FIG. 1 is a graphical illustration of viscosities of various exemplary epoxy compounds against temperature.

FIG. 1 is a graphical illustration of viscosities of various exemplary epoxy compounds against temperature. Five widely-used epoxy compounds for die attachment in electronic packages are illustrated, each of which contains silver epoxy. These epoxy compounds were tested for the relationship between their temperatures and their viscosities using a viscometer, at temperatures ranging from 25 to 60° C.

For all the tested epoxy compounds, it could be observed that the viscosities of the epoxy compounds would steadily decrease for most of the temperature ranges comprising approximately the temperatures of 25° C. and 60° C.

It is apparent that all the graphs have similar trends, in that viscosities of the respective epoxy compounds decrease at elevated temperatures in the range from 25° C. to about 60° C. It can thus be assumed from these graphs that there is a temperature window or range for these epoxy compounds, within which it would be more efficient to decrease the viscosities of these epoxy compounds by elevating their temperatures within the aforesaid range. Accordingly, the preferred working temperature windows of the five tested silver epoxy compounds would be at about 25° C. to 60° C.

The process times during bonding is preferably controlled such that a semiconductor die is placed onto the dispensed epoxy for bonding before the decreased viscosity of the applied epoxy due to heating starts to adversely influence the bonding process that follows.

Figure 2:
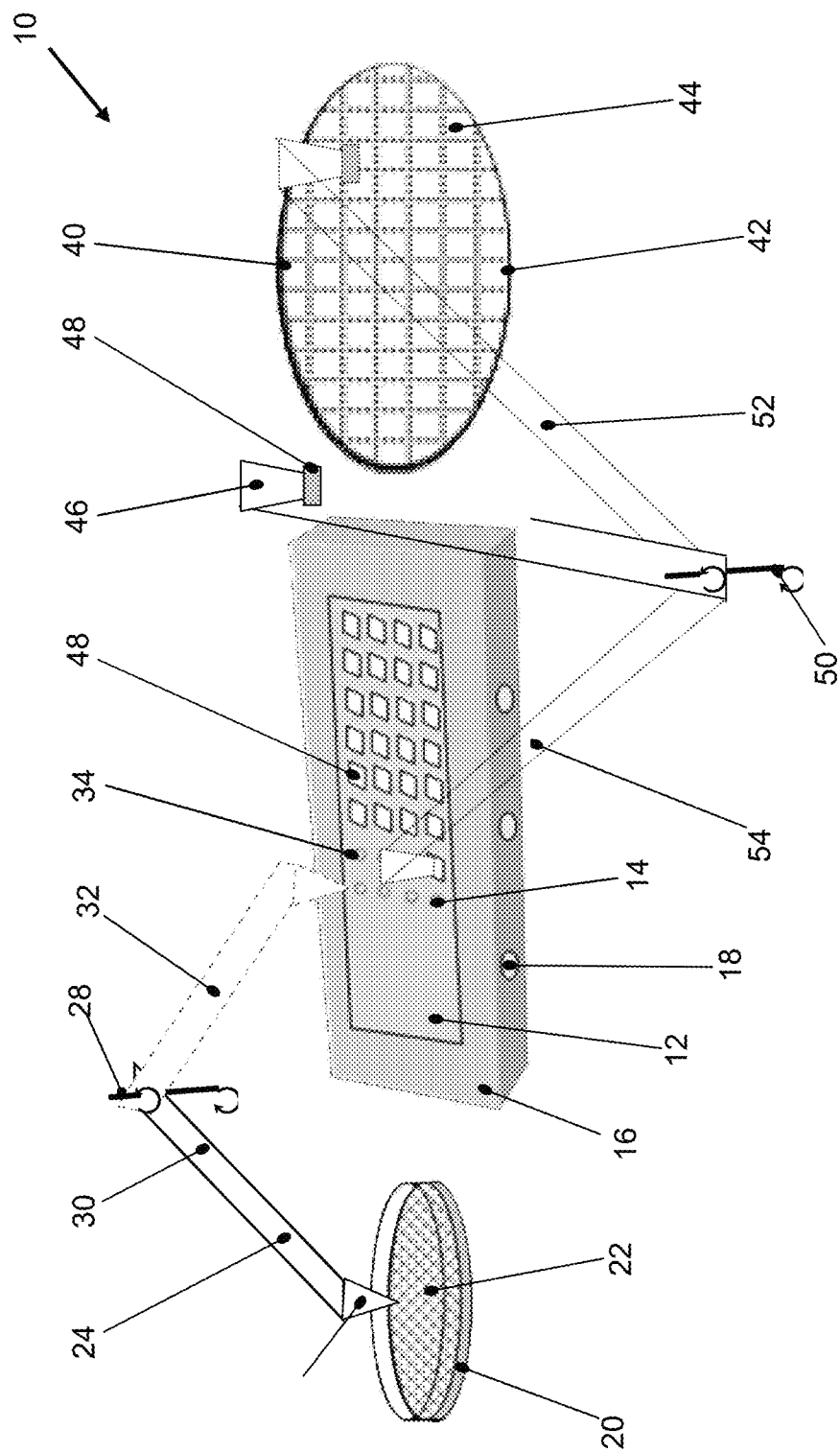
FIG. 2 is a schematic illustration of a die attachment apparatus using epoxy according to the preferred embodiment of the invention.

FIG. 2 is a schematic illustration of a die attachment apparatus 10 for bonding a semiconductor die 44 onto a substrate 12 using epoxy during a semiconductor packaging process according to the preferred embodiment of the invention. The substrate 12 is supported and held on a heater platform, which may be in the form of a vacuum chuck 16. The substrate 12 comprises a matrix of bond pads 14 on which the semiconductor dice 44 are to be bonded. A heater, such as a plurality of heater rods 18 embedded in the vacuum chuck 16, is incorporated for heating the substrate 12 that is being supported on the vacuum chuck 16.

As such, the vacuum chuck 16 functions also as a heating platform or anvil block to heat any epoxy which has been dispensed on the substrate 12. The heating platform or vacuum chuck 16 includes a temperature controller (not shown) for controlling the preheating of the substrate 12 to a predetermined temperature, T, specifically to within the range of 25° C. to 60° C., but more preferably to within the range of 35° C. to 50° C.

A container for a die attachment medium or bonding material, which may be in the form of an epoxy reservoir container 20, holds a reservoir of bonding material, such as an epoxy reservoir 22. The epoxy reservoir container 20 is continually rotated by a rotary motor (not shown). An epoxy dispenser, such as a transfer arm 24 having a stamp pin or transfer pin 26 at one end thereof, is operative to rotate around a transfer arm rotary axis 28, and is also movable in upwards and downwards directions, for transferring epoxy from the epoxy reservoir 22 to the bond pads 14. Thus, the transfer arm 24 is movable between a dipping position 30 for dipping the transfer pin 26 in the epoxy reservoir 24, and a stamping position 32 wherein epoxy collected on the transfer pin 26 is dispensed as epoxy dots 34 onto positions of the bond pads 14.

The transfer arm 24 first moves the transfer pin 26 to a position above the epoxy reservoir 22, and then moves the transfer pin 26 down to dip it in the epoxy reservoir 22. A collected volume of epoxy is generally controlled by the pin size and the thickness of the epoxy reservoir 22. A portion of the volume of epoxy collected on the transfer pin 26 will be transferred to the substrate 12 which has been preheated to the temperature T, when the transfer arm 24 moves from the dipping position 30 to the stamping position 32. When the transfer pin 26 with the volume of epoxy touches a surface of the bond pad 14 of the preheated substrate 12, an epoxy drop 34 that is formed on the bond pad 14 will be heated.

The viscosity of the deposited epoxy will be reduced, which will enhance wetting of epoxy on the surface of the bond pad 14 where the epoxy dot 34 has been deposited. Once the transfer arm 24 moves upward and leaves the substrate 12 surface, the epoxy tail connected to the epoxy dot 34 breaks. The epoxy dot 34 will form better as compared to the prior art due to the heating of the substrate 12 within the aforesaid controlled range of temperatures. For example, the problem of dripping is controlled better, since the tail breaks early due to the lowered viscosity of the epoxy, but only after the epoxy has been dispensed.

A wafer 40 comprising an array of semiconductor dice 44 is secured on a wafer table 42 located on an opposite side of the vacuum check 16 from the epoxy reservoir container 20. A pick head 46 (including a pick arm and a collet) is operative to pick up and hold a semiconductor die 44 from the wafer 40 and to place the same onto an epoxy dot 34 that has been dispensed onto the bond pad 14. The picked semiconductor die 48 is then bonded onto the bond pad 14 of the substrate 12.

The pick head 46 similarly rotates about a pick head rotary axis 50 between a pick-up position 52 on the wafer 40 and a bonding position 54 above the bond pads 14 of the substrate 12.

The pick head 46 is moved to the pick-up position 52 to pick up a semiconductor die 44 from the wafer 20 on the wafer table 42, and is then rotated about the pick head rotary axis 50 from the pick-up position 52 to the bonding position 54. The picked semiconductor die 48 on the pick head 46 is transferred to the substrate side, and is then placed on top of an epoxy dot 34 on a bond pad 14. Such an optimal bonding process is used to control the bonded semiconductor die 48 to address common bonding requirements of bond line thickness ("BLT"), bleed-out, bonding coverage, absence of voids, fillet height, etc.

As discussed above, appropriate heating can decrease the viscosity of epoxy bonding material. The lower the viscosity of the epoxy dot 34, the better the wetting on a substrate 12. Prior to the pick head 46 moving a picked semiconductor die 48 from the pick up position 52 to the bonding position 54, the vacuum chuck 16 is operative to preheat the substrate 12 to the predetermined temperature, T. Once the epoxy compound collected on the tip of the transfer pin 26 contacts the heated substrate 12, the epoxy compound will be heated by the preheated substrate 12 towards the pre-determined temperature, T.

In the preferred embodiment, an initial heating phase is adopted which lasts for not more than 10 seconds, but more preferably completed in 0.1 to 10 seconds, following the dispensing process before the picked semiconductor die 48 is placed on the epoxy dot 34. Thereafter, bonding is immediately conducted, such that the process time for a bonding cycle of a picked semiconductor die 48 comprising a time taken to dispense an epoxy dot 34 on the substrate 12 and completing bonding of a picked semiconductor die 48 on the substrate 12, may be controlled to be within a duration of 0.1 to 600 seconds, but more preferably within a duration of 0.1 to 100 seconds.

At the predetermined temperature T, the enhanced wetting ability of the thermally-enhanced epoxy would be utilized to improve the performance of the transfer or stamping process. The performance of the die bonding that follows can also be improved as a result.

The aforesaid transfer process makes it easier to control the problem of tailing. The mechanism of the invention serves to heat the epoxy at an interface between the epoxy and substrate surface due to the preheated substrate 12. Good wetting of the bond pad 14 would reduce the thickness of the stamped epoxy dot 34, and make it thinner. Consequently, the problems of tailing, dripping and flatting will benefit from the thinner shape and lower viscosity of the stamped epoxy.

Accordingly, since the substrate 12 is heated at the time when the epoxy dots 34 come into contact with the bond pads 14, viscosity of the epoxy can be reduced contemporaneously while the epoxy dots 34 are formed, and this promotes wetting as compared to the prior art.

Whilst one preferred embodiment of the invention has been described above, it should be appreciated that variations of the invention are possible. For instance, besides forming epoxy dots 34 via a stamping process, the formation of epoxy dots may also be conducted by a dispensing process, such as by the use of a syringe and nozzle attached to a container for dispensing epoxy.

Although silver epoxy is one of the die bonding materials that is suitable for implementing the aforesaid invention, silicone, clear epoxy and other polyamide may also be applicable. The substrate 12 on which die bonding is performed may be a lead frame, printed circuit board, flexible substrate, direct bonded copper ("DBC") substrates, or may be substrates made from other materials. Moreover, besides using heater rods 18 for heating the vacuum chuck 16 or heating platform, the heating medium may also comprise a plate heater, film heater, lamp or other suitable heating mechanisms.

When the epoxy used in the description is preferably silver epoxy, the temperature variation on a whole of the substrate 12 should be controlled within a margin of plus/minus 5° C., and more preferable, within a margin of plus/minus 1° C.

After the aforesaid bonding process, other packaging process, such as wire bonding, molding, trim and form and singulation may subsequently be performed.

The invention described herein is susceptible to variations, modifications and/or additions other than those specifically described and it is to be understood that the invention includes all such variations, modifications and/or additions which fall within the spirit and scope of the above description.

The invention claimed is:

1. Method for bonding a semiconductor die onto a substrate using epoxy, comprising the steps of:
    supporting the substrate on a heating platform;
    conducting preheating of the substrate with the heating platform to a temperature within a temperature range of between 25° C. and 60° C.;
    after preheating the substrate to the said temperature and while maintaining the substrate within the said temperature range, using an epoxy dispenser to deposit an epoxy dot onto the substrate, wherein the preheated substrate causes a viscosity of the epoxy deposited to be reduced; and thereafter
    placing the semiconductor die onto the epoxy dot with a pick head to thereby bond the semiconductor die onto the substrate.

2. Method as claimed in claim 1, wherein the heating platform comprises a vacuum chuck for supporting the substrate, and the vacuum chuck further incorporates a heater for heating the substrate.

3. Method as claimed in claim 2, wherein the heater comprises a plurality of heater rods embedded in the vacuum chuck.

4. Method as claimed in claim 1, wherein the substrate is heated by the heating platform to a temperature of between 35° C. and 50° C.

5. Method as claimed in claim 1, wherein the epoxy dot heated by the preheated substrate results in enhanced wetting of the epoxy on a surface of a bond pad of the substrate where the epoxy is deposited.

6. Method as claimed in claim 1, wherein the semiconductor die is placed onto the epoxy dot before the reduced viscosity of the epoxy due to heating adversely influences the bonding of the semiconductor die by the pick head.

7. Method as claimed in claim 1, wherein the epoxy dot is deposited onto the preheated substrate for not more than 10 seconds before the semiconductor die is placed onto the epoxy dot.

8. Method as claimed in claim 7, wherein the epoxy dot is deposited onto the preheated substrate for 0.1 to 10 seconds before the semiconductor die is placed onto the epoxy dot.

9. Method as claimed in claim 7, wherein a time taken to dispense an epoxy dot on the substrate and completing bonding of a semiconductor die on the substrate is between 0.1 and 100 seconds.

10. Method as claimed in claim 1, wherein the epoxy dispenser comprises a transfer pin, and the step of depositing the epoxy dot onto the substrate comprises the steps of collecting a volume of epoxy from an epoxy reservoir with the transfer pin, and then transferring and depositing a portion of the volume of epoxy onto the substrate with the transfer pin.

11. Method as claimed in claim 1, wherein a temperature variation on a whole of the substrate is controlled to within a margin of plus/minus 5° C.

12. Method as claimed in claim 1, wherein the epoxy comprises silver epoxy.

13. Apparatus for bonding a semiconductor die onto a substrate using epoxy, the apparatus comprising:
    a heating platform for supporting the substrate, the heating platform being operative to preheat the substrate to a temperature within a temperature range of between 25° C. and 60° C.;
    an epoxy dispenser for depositing an epoxy dot onto the substrate which has been preheated to the said temperature, wherein the preheated substrate causes a viscosity of the epoxy deposited to be reduced when the substrate is maintained within the said temperature range; and
    a pick head for placing the semiconductor die onto the epoxy dot to thereby bond the semiconductor die onto the substrate.

* * * * *